(12) United States Patent
Kathman (10) Patent No.: US 8,054,564 B1
(45) Date of Patent: Nov. 8, 2011

(54) OPTICAL DEVICE AND ASSOCIATED METHODS

(75) Inventor: Alan Kathman, Charlotte, NC (US)

(73) Assignee: Digitaloptics Corporation East, Charlotte, NC (US)

( * ) Notice: Subject to any disclaimer, the term of this patent is extended or adjusted under 35 U.S.C. 154(b) by 0 days.

(21) Appl. No.: 12/662,867

(22) Filed: May 7, 2010

(51) Int. Cl.
  *G02B 11/00* (2006.01)
  *G02B 1/00* (2006.01)
(52) U.S. Cl. .................. 359/796; 359/741; 359/797
(58) Field of Classification Search .......... 359/741–743, 359/754–797
  See application file for complete search history.

(56) References Cited

U.S. PATENT DOCUMENTS

| | | | | |
|---|---|---|---|---|
| 7,474,480 B2* | 1/2009 | Oh et al. | ........ | 359/794 |
| 7,821,725 B2* | 10/2010 | Sato et al. | ........ | 359/773 |
| 2004/0136069 A1* | 7/2004 | Li et al. | ........ | 359/556 |
| 2005/0207031 A1* | 9/2005 | Eckhardt et al. | ........ | 359/741 |
| 2009/0290833 A1 | 11/2009 | Han et al. | | |
| 2010/0002314 A1 | 1/2010 | Duparre | | |
| 2011/0007195 A1 | 1/2011 | Fukuta | | |
| 2011/0013070 A1 | 1/2011 | Hirao et al. | | |

FOREIGN PATENT DOCUMENTS

| | | |
|---|---|---|
| EP | 2246722 A1 | 11/2010 |
| WO | WO 2009/101928 A1 | 8/2009 |
| WO | WO 2009/116492 A1 | 9/2009 |
| WO | WO 2009/120346 A1 | 10/2009 |

OTHER PUBLICATIONS

PCT Invitation to Pay Additional Fees and, Where Applicable, Protest Fee and Results of Partial International Search dated Jul. 29, 2011 (Kathman).

* cited by examiner

*Primary Examiner* — Darryl J Collins
(74) *Attorney, Agent, or Firm* — Lee & Morse, P.C.

(57) ABSTRACT

An optical device includes a transparent substrate, a first replicated refractive surface on a first surface of the substrate in a first material, and a second replicated refractive surface on a second surface, opposite the first surface, and made of a second material, different from the first material. The material and curvature of the first replicated surface and the material and curvature of the second replicated surface may be configured to substantially reduce the chromatic dispersion and/or the thermal sensitivity of the optical device.

29 Claims, 5 Drawing Sheets

TABLE 1

| Surface | Type | Radius (mm) | Thickness (mm) | Material | Index | CTE (ppm) | dn/dT (ppm) | V Abbe # | X (/C) | Paraxial f (mm) | X/f | 1/fV |
|---|---|---|---|---|---|---|---|---|---|---|---|---|
| Object | Standard | Infinite | 1000 | | | | | | | | | |
| 1 | Even asphere | 0.9023 | 0.42271 | Polymer 1 | 1.518 | 89 | -149 | 50.7 | 134.5 | 1.742 | 77.24 | 0.0113 |
| 2 | Standard | Infinite | 0.45162 | SF57 | 1.847 | 8.3 | 7.2 | 23.8 | | | | |
| Stop | Standard | Infinite | 0.02977 | Polymer 2 | 1.553 | 91 | -166 | 43.4 | 143.08 | -4.696 | -30.47 | -0.0049 |
| 4 | Even asphere | 2.5968 | 0.30657 | | | | | | | | | |
| 5 | Even asphere | -2.148 | 0.17762 | Polymer 2 | 1.553 | 91 | -166 | 43.4 | 157.21 | -3.884 | -40.48 | 0.0059 |
| 6 | Standard | Infinite | 1.956 | N-PK52A | 1.497 | 13.01 | -19.7 | 81.61 | | | | |
| 7 | Standard | Infinite | 0.60024 | Polymer 1 | 1.518 | 89 | -149 | 50.7 | 148.7 | -25.224 | -5.89 | -0.008 |
| 8 | Even asphere | 13.066 | 0.33645 | | | | | | | | | |
| Image | Standard | Infinite | | | | | | | | | | |
| | | | | | | | | | | | SUM X/f | SUM 1/fV |
| | | | | | | | | | | | 0.40 | -0.0003 |

FIG. 5

OPTICAL DEVICE AND ASSOCIATED METHODS

BACKGROUND

1. Field of the Invention

Embodiments are directed to an optical device and associated methods. More particularly, embodiments are directed to an optical device having enhanced performance and associated methods.

2. Description of Related Art

There are advantages and disadvantages to most types of materials used to make optical surfaces, i.e., surfaces having optical power, both in manufacturing and performance. For example, polymer materials may allow a wide variety of shapes to be accurately realized, and may provide more degrees of freedom in making wafer based optical elements. However, such materials may suffer from high temperature dependence of optical characteristics, e.g., refractive index, and mechanical characteristics, e.g., surface shape. Further, when a thickness of polymer material needed to create a specific lens design increases, excessive shrinkage and shape deformation may occur. In contrast, while glass has a relatively low coefficient of thermal expansion (CTE) and a low optical thermal coefficient, when sags of glass lenses increases and a number of lenses to be created simultaneously increases, non-uniformity of the lenses may increase, reducing yield depending upon manufacturing techniques employed.

In order to realize improved performance, including over wider thermal ranges and more accurate chromatic performance, lenses may be made in different materials and then discretely packaged or secured together. However, such structures are not made monolithically and are thus expensive to manufacture, particularly in small form factors.

The above information disclosed in this Background section is only for enhancement of understanding of the background of the invention, and therefore it may contain information that does not form prior art.

SUMMARY OF THE INVENTION

Embodiments are therefore directed to an optical device and associated methods, which substantially overcome one or more of the problems due to the limitations and disadvantages of the related art.

It is therefore a feature of an embodiment to create an optical device and associated methods in which multiple surface structures are self-aligned.

It is another feature of an embodiment to create an optical device and associated methods in which multiple surface structures having improved optothermal performance.

It is yet another feature of an embodiment to create an optical device and associated methods in which a number of structures needed to realize a particular output may be reduced.

At least one of the above and other features and advantages may be realized by providing an optical device, including a transparent substrate, a first replicated refractive surface on a first surface of the substrate in a first material, and a second replicated refractive surface on a second surface, opposite the first surface, and made of a second material, different from the first material.

The first and second surfaces of the substrate may be substantially parallel and may be planar.

The material and curvature of the first replicated surface and the material and curvature of the second replicated surface may be configured to substantially reduce the chromatic dispersion of the optical device and/or to substantially reduce the thermal sensitivity of the optical device.

The optical device may include another transparent substrate adjacent the transparent substrate, a third replicated refractive surface on a first surface of the another substrate in a third material, and a fourth replicated refractive surface on a second surface, opposite the first surface, of the another substrate and in a fourth material, the first to fourth replicated refractive surfaces being aligned along an optical axis. The third and fourth materials may be the same. The first surface of the another substrate may be secured to the second surface of the substrate. The first and fourth materials may be the same. The second and third materials may be the same. The substrate and the another substrate may be formed of different materials. The first and second surfaces of the substrate and the first and second surfaces of the another substrate all may be substantially parallel. The first and second surfaces of the substrate and the first and second surfaces of the another substrate all may be substantially planar. The substrate and the another substrate have different thicknesses. The first to fourth materials all may be different. At least one of the first and second refractive surfaces may be aspheric and at least one of the third and fourth refractive surfaces may be aspheric.

The optical device as may include an image sensor configured to receive light output from the fourth replicated refractive surface. Light output from the fourth replicated refractive surface may be incident directly on the image sensor.

The first replicated refractive surface and the second replicated refractive surface may be formed on the substrate while the substrate is part of a wafer. At least one of the above and other features and advantages may be realized by providing an optical device, including a first surface in a first material having a first coefficient of optothermal expansion, and a second surface in a second material having a second coefficient of optothermal expansion on the first surface, the second surface having a radius of curvature, the first and second surfaces being designed to substantially reduce the coefficient of optothermal expansion for the optical device.

The optical device as claimed in claim 20, wherein, when first surface has a radius of curvature R1, the radius of curvature R2 of the second surface is given by $$R2 = R1\left[1 + \frac{X2(n2-1)}{X1(n1-1)}\right]$$

where X1 is the first coefficient of optothermal expansion, X2 is the second coefficient of optothermal expansion, n1 is the refractive index of the first material, and n2 is the refractive index of the second material.

At least one of the above and other features and advantages may be realized by providing an optical device, including a first surface in a first material having a first coefficient of optothermal expansion and a second surface in a second material having a second coefficient of optothermal expansion on the first surface, the second surface having a radius of curvature, the first and second surfaces being designed to substantially reduce the chromatic dispersion for the optical device.

At least one of the above and other features and advantages may be realized by providing a method of forming an optical device, the method including providing a plurality of first surfaces in a first material having a first coefficient of optothermal expansion, providing a plurality of second surfaces in a second material having a second coefficient of optothermal expansion on corresponding first surfaces, the second surfaces having a radius of curvature, thereby forming a plurality of optical devices, designing the first and second surfaces to minimize at least one of the coefficient of optothermal expansion and chromatic dispersion for the optical device, and singulating the plurality of optical devices to from the optical device.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. As used herein, the term "wafer" should be understood as meaning any substrate on which a plurality of components are formed in a horizontal direction which are to be horizontally separated by singulation in a vertical direction prior to final use. Like reference numerals may refer to like elements throughout.

Figure 1:
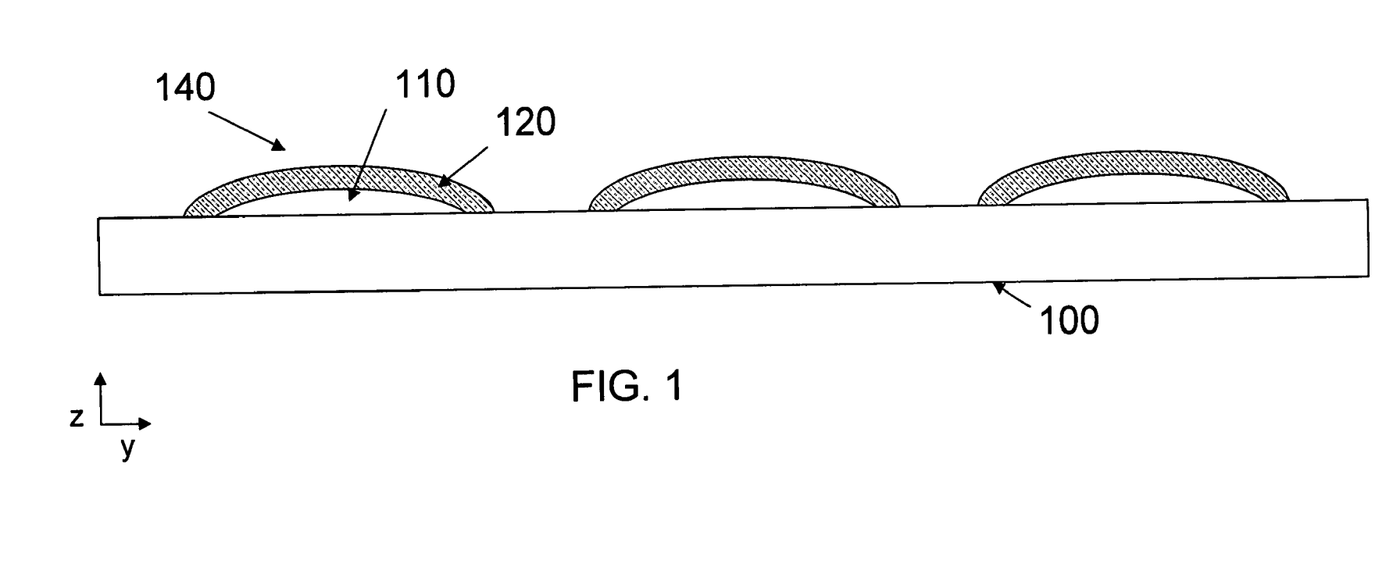
FIG. 1 illustrates a schematic view of an optical structure in accordance with an embodiment.

As illustrated in FIG. 1, a lens structure 140 may include a cured polymer 120 on a base lens 110 on a substrate 100. A plurality of such lens structures 140 may be formed on the substrate 100. The substrate 100 may then be separated along the z-axis to form any desired array or individual final lens structures 140. Examples regarding manufacturing such lens structures 140 may be found, for example, in co-pending U.S. patent application Ser. No. 12/382,944, filed on Mar. 26, 2009, and entitled "OPTICAL DEVICE INCLUDING AT LEAST ONE REPLICATED SURFACE AND ASSOCIATED METHODS," which is hereby incorporated by reference in its entirety for all purposes.

While the base lenses 110 are illustrated in FIG. 1 as being in the substrate 100, multiple replication processes may also be used, i.e., using replication, e.g., hot embossing, to form the base lenses 110. The, different materials for a subsequent replication step(s) may be selected, enabling better performance and thermal stability. Further, while the cured polymer 120 is illustrated in FIG. 1 as only being on the individual base lenses 110, the cured polymer 120 could be provided on the entire substrate 100 or may be provided on a master (not shown) used to pattern the polymer material.

In accordance with an embodiment, overmolding may be used to correct for non-uniformities across an array of base lenses 110. This may be especially useful for base lenses 110 having a high sag and/or over a large diameter wafer. When the cured polymer 120 is to compensate for variations in the manufacturing process used to make the base lenses 110, the base lenses 110 may be characterized in terms of uniformity of optical performance, e.g., radius of curvature (ROC), conic, etc., to determine systematic variation resulting from the manufacturing process. Then, such systematic variation may be compensated in designing a master or mold. Thus, a high yield, uniform lens array using the individually compensated master to replicate a polymer material to form the cured polymer 120. Suitable replication techniques include ultraviolet (UV) cured embossing, hot embossing, nano imprinting, etc.

In accordance with another embodiment, use of more than one material may improve the thermal performance as compared to a single replicated polymer lens and may mitigate physical shrinkage of the polymer material during replication. The polymer material may be replicated to realize final optical structures 140 having a predetermined optical specification. For example, the base lenses 110 may have a sag less than a predetermined sag and a master may be designed for use with a polymer material to provide the final optical structure 140 with the predetermined sag.

Such base lenses 110 may be more readily and cheaply manufactured than finished lenses having the predetermined optical specifications. If the index of refraction of the polymer material is the same as that of the glass material, then some profile irregularities of the glass wafer after the base lens is formed do not affect the performance of the finished lens. That is, the performance may be determined solely by the profile described by the polymer-air interface and the distance from that interface to the planar surface on the opposite side of the wafer. In reality, the index of refraction of the polymer won't exactly match the glass, so the profile of the glass will affect the performance somewhat, but this effect may be minimized in the design. An anti-reflective coating may be used to reduce the effect of the index contrast between the polymer and the glass. Since a relatively thin layer of polymer material may be employed, shrinkage of the polymer material is much less of an issue. Finally, the final optical devices 140 may have a low temperature dependence due to the low CTE of the base lenses 110 and may be very precisely formed due to replication in the polymer material.

The design of the cured polymer 120 may be determined in consideration of the optothermal coefficients of the cured polymer 120 and the material used for the bases lenses 110. For example, the base lens 110 may be glass having a dn/dt of 12.8 ppm/° C., a CTE of 0.55 ppm/° C., and a refractive index of 1.46, and may have a radius of curvature R1 and a focal length f1. The polymer material used to form the cured polymer 120 may be a moldable material having a dn/dt of 200 ppm/° C., a CTE of 60 ppm/° C., and a refractive index of 1.53, and, after replication, may have a radius of curvature R2 and a focal length f2. Equation 1 is an approximation of an optothermal expansion coefficient X:

$$X \approx CTE - \left(\frac{1}{n-1}\right)\frac{dn}{dt} \qquad (1)$$

For the final optical device 140 to be fully athermal, then the following relationship must be satisfied:

$$\frac{1}{f1}X1 = \frac{1}{f2}X2 \qquad (2)$$

The focal lengths may be expressed as indicated in equation 3.

$$\frac{1}{f1} = (n1-1)\left(\frac{1}{R1}\right) \text{ and} \qquad (3)$$

$$\frac{1}{f2} = (n2-1)\left(\frac{1}{R2} - \frac{1}{R1}\right)$$

substituting equation 2 into equation 3:

$$R2 = R1\left[1 + \frac{X2(n2-1)}{X1(n1-1)}\right] \qquad (4)$$

Thus, for the materials noted above, the final optical device 140 will be athermal when R1=1.0497*R2. Of course in practice, any solution that approaches this condition will improve optothermal performance.

Embodiments may be directed to forming structures in a polymer material on a rigid substrate without base structures formed in the substrate, i.e., on a substantially planar surface. Thus, many more materials may be available for use as a rigid substrate, e.g., materials having a wide range of refractive indexes, Abbe numbers, and/or CTEs. In particular, a material for the rigid substrate may compensate for temperature variations in the polymer material. While glass itself is less sensitive to temperature than most other materials available to make lens structures, i.e., has a low CTE, any curvature or power put into glass substrate through manufacture drives up costs. Thus, designs are typically trade-offs between cost and performance.

Uses of materials having different optical properties, such as different refractive indexes, Abbe numbers, and/or CTEs, will now be discussed. According to embodiments, using materials having different optical properties may improve the imaging performance and may reduce the thickness of the system. Additionally, use of different materials according to embodiments may provide improved performance over a range of wavelengths and/or operational temperatures and other environmental factors. In other words, use of the different materials may allow increased degrees of freedom, which may result in a more effective balancing between cost and performance for the lens structure. Different designs may incorporate more than two replication materials having different optical properties. A thickness of the rigid substrate, after singulation to be referred to as a plate, is also a design parameter.

First, optothermal performance using a polymer material p on a substrate material s compared to use of a conventional bulk material m will be discussed. As used herein, an optothermal expansion coefficient X is given by equation 5:

$$X = \frac{1}{f}\frac{df}{dT} \qquad (5)$$

As noted above in connection with equation (1), the optothermal expansion coefficient X may be approximated as:

$$X_m \approx CTE_m - \left(\frac{1}{n_m-1}\right)\frac{dn_m}{dt} \qquad (6)$$

For most plastics, $CTE_m$ is both positive and a large value relative to other optical materials, while $dn_m/dT$ is negative. Thus, the focal length of most all plastic lenses will always increase as temperature increases.

For the polymer material p on the substrate material s, and assuming the polymer undergoes elastic deformation, the optothermal expansion coefficient X may be approximated as:

$$X_p \approx 3*CTE_s - 2*CTE_p - \left(\frac{1}{n_p-1}\right)\frac{dn_p}{dt} \qquad (7)$$

As noted above, the CTE for most polymers is positive and significantly larger than the CTE of materials, e.g., glass, used for the substrate. Further, $dn_p/dT$ for most polymers is negative. Thus, the focal length of such a polymer on substrate lens structure may have a reduced optothermal expansion coefficient X, i.e., may be less sensitive to temperature.

The increase in degrees of freedom may be even further utilized when an optical device is to include more than one individual lens structure, i.e., lens structures separated by a plate or air. In further detail, while different bulk materials may be used in a lens structure having a plurality of individual lenses to achromatize and athermalize the lens structure, only one degree of freedom is available for each lens for such correction, e.g., the selection of the bulk material itself. In contrast, in accordance with embodiments, more degrees of freedom may be realized, as each lens surface may have a unique $X_p$ and $V_p$. Further, as compared with a polymer bulk lens material, embodiments may provide reduced optothermal coefficients of expansion. Thus, even though the curvatures of the lens surfaces in embodiments may be similar to those in bulk materials, the overall imaging performance thereof may be improved, as will be discussed in detail below.

Figure 2:
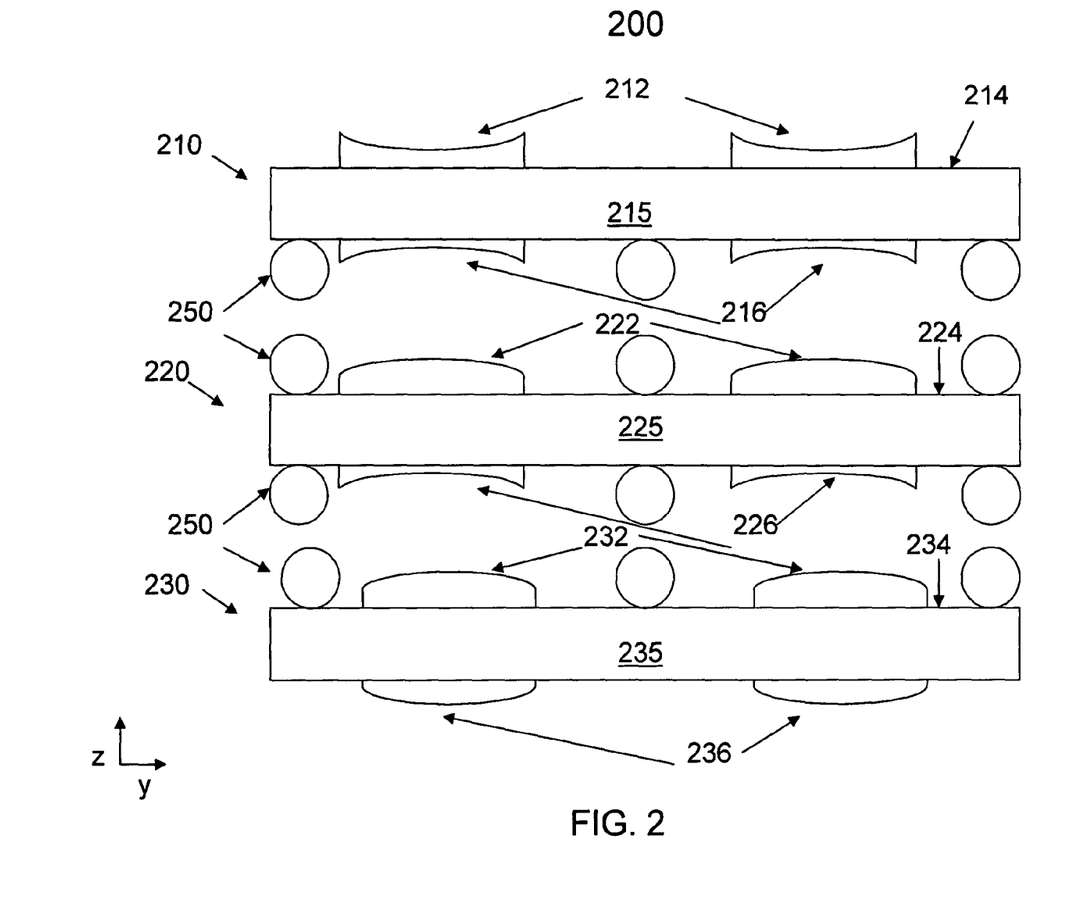
FIG. 2 illustrates a schematic view of a plurality of optical structures in accordance with an embodiment.

A plurality of lens structure, each having a polymer on opposite sides of a rigid substrate, is illustrated in FIG. 2. In particular, a lens assembly 200 may include a plurality of first lens structures 210, a plurality of second lens structures 220, and a plurality of third lens structures 230. Each first lens structure 210 may include a first lens surface 212, here a concave surface, a plate 214, here integral with other plates to form a wafer 215, and second lens surface 216, here a concave surface. Each second lens structure 220 may include a third lens surface 222, here a convex surface, a plate 224, here integral with other plates to form a wafer 225, and fourth lens surface 226, here a concave surface. Each third lens structure 230 may include a fifth surface 232, here a convex surface, a plate 234, here integral with other plates to form a wafer 235, and sixth lens surface 236, here a convex surface.

Each of the wafers 215, 225, and 235 may be made of different materials, or may be the same material. All of the polymer materials in which the first to sixth lens surfaces are formed may be different. At least one of the lens structures 210 to 230 may have different polymers for the lens surfaces thereon. The use of the rigid substrates having substantially planar surfaces may constrain more ductile polymers along the lateral transverse direction, so expansion thereof is no longer uniform and isotropic. This materially changes the optical performance, allowing improved imaging as compared with molded plastic lenses.

Adhesive material 250, e.g., epoxy or solder, may be provided between opposing surfaces of adjacent wafers. Adhesive material 250 may be provided on one or both opposing surfaces, or may be a stamped structure between the opposing surfaces. The adhesive material 250 may be provided in between lens structures to form a final optical device, here assuming single lens structures for each final optical device.

To achromatize and athermalize the lens structure, respectively, of the particular example illustrated in FIG. 2, the following terms of Equations (8) and (9) should approach zero:

$$\frac{X_{p1}}{f_1} + \frac{X_{p2}}{f_2} + \frac{X_{p3}}{f_3} + \frac{X_{p4}}{f_4} + \frac{X_{p5}}{f_5} + \frac{X_{p6}}{f_6} = \frac{X}{f} \quad (8)$$

$$\frac{1}{f_1 V_{p1}} + \frac{1}{f_2 V_{p2}} + \frac{1}{f_3 V_{p3}} + \frac{1}{f_4 V_{p4}} + \frac{1}{f_5 V_{p5}} + \frac{1}{f_6 V_{p6}} = \frac{1}{fV} \quad (9)$$

Where, for the first to sixth lenses surfaces, $f_1$ to $f_6$ indicate focal lengths and $p_1$ to $p_6$ indicate the polymer materials. Of course, some of the polymer materials and/or focal lengths may be equal.

Figure 3:
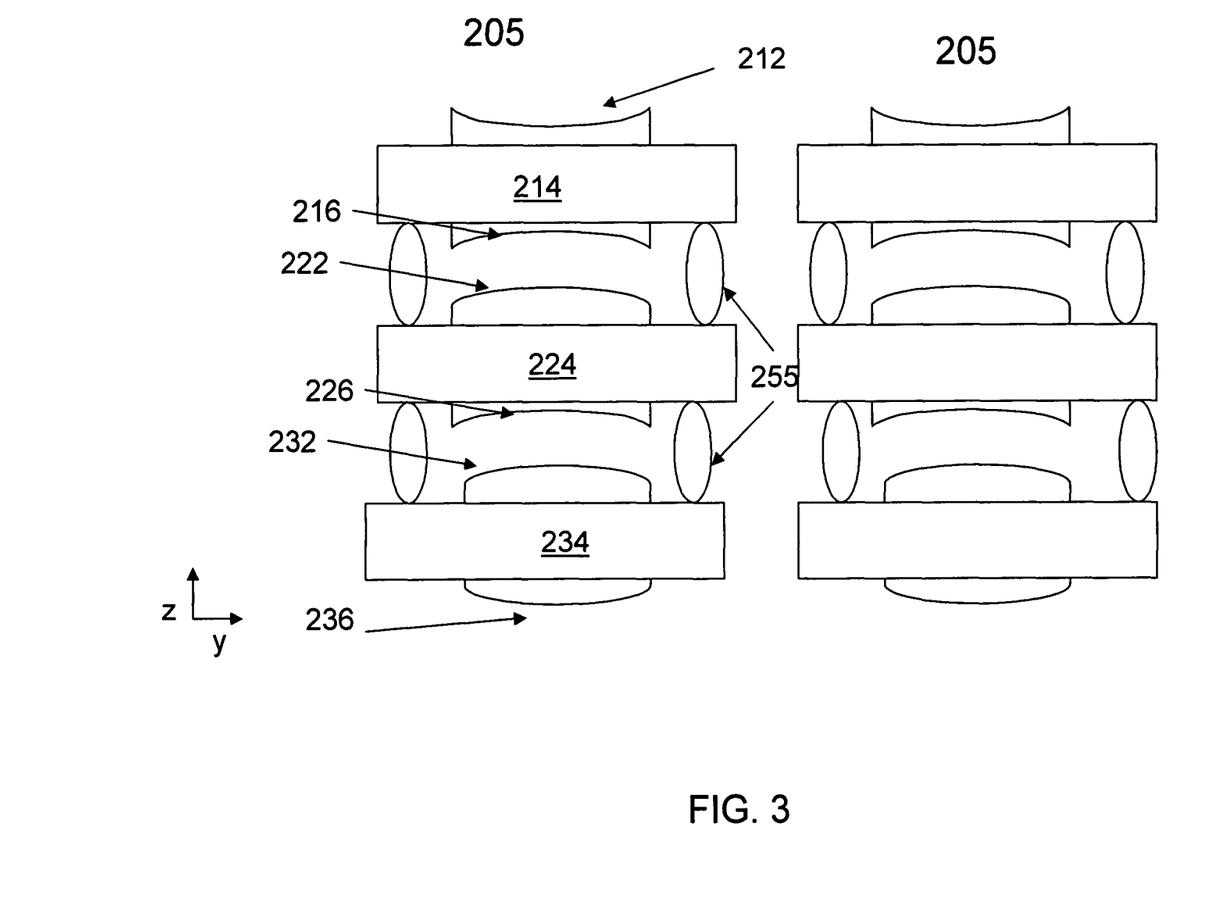
FIG. 3 illustrates a schematic view of an optical structure of FIG. 2 after singulation.

As illustrated in FIG. 3, the lens assembly 200 may be secured via the adhesive material 250, which may be altered during curing or other processing, to form bonds 255, and then singulated along the z direction to form a plurality of final optical devices 205. Having good optothermal characteristics may be of particular importance with forming the final optical devices includes subjecting the lens assembly to high temperatures, e.g., during processing the adhesive material, making electrical connections to optoelectronic devices associated with the final optical devices, and so forth.

Resultant optical devices may be used in numerous applications, especially those having strict size constraints, e.g., cameras. As these lens assemblies may be made monolithically, i.e., multiple lens structures may be made a wafer level and then singulated and/or secured to other wafers containing additional elements, manufacturing costs may be reduced.

Figure 4:
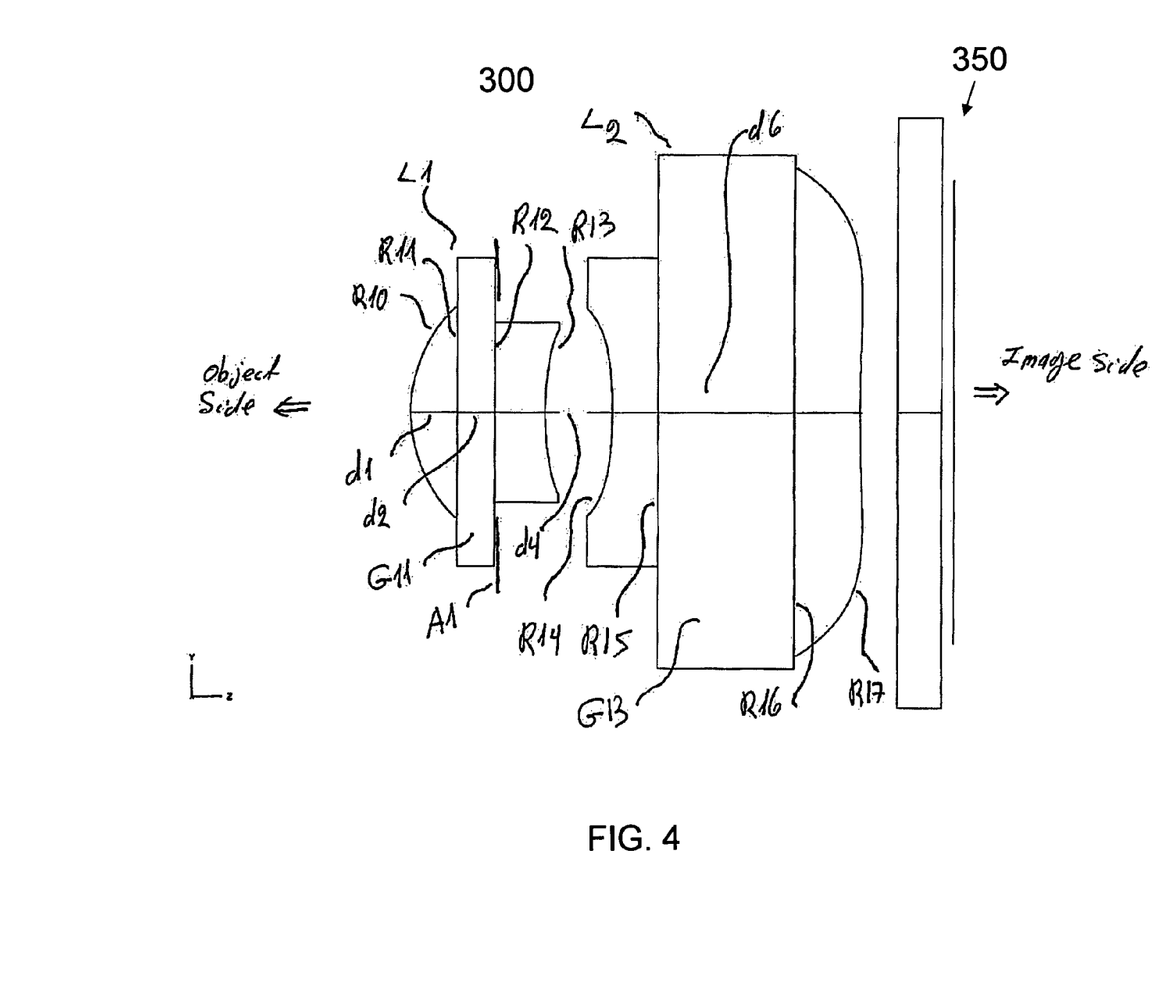
FIG. 4 illustrates a schematic view of a specific example of an optical structure to be used in a camera system.

A particular example of an optical device 300, e.g., a camera, is illustrated in FIG. 4. The optical device 300 may include a sensor 350, with the particular design discussed below being for a 3 Mp sensor with a 1.75 μm pixel size and an F number of 2.85. The optical device 300 may include a first lens structure L1 and a second lens structure L2, from the object side of the optical device 300, respectively. The optical device 300 may further include an aperture stop A1. As illustrated in FIG. 4, the aperture stop A1 is located between the first and second lens structures, L1 and L2. Alternatively, the aperture stop A1 may be located in the front, i.e., on the object side.

The radii of curvature of the first and second lens structures L1 and L2 are referred to by the letter R followed by a number denoting their order from the object side of the optical device 300. More specifically, Ri is the axial curvature radius of the ith surface. Similarly, the refractive index ni denotes the refractive index of the lens medium constituted by the ith surface. The on-axis surface spacing of lenses along the optical axis between the optical elements are referred to by the letter d followed by a number denoting their order from the object side of the optical device 300.

Each of the first and second lens structures L1 and L2 may include a single transparent plate of refractive material with two opposing refractive surfaces being made of materials having different refractive indices and/or different dispersive characteristics. These two refractive surfaces may be separated by a glass plate.

The first and second lens structures L1 and L2 may be produced using the replication process. For example, radii of curvature R10 and R13 may be produced by a curing process on a glass plate G11 of thickness d2 and the radii of curvature R14 and R17 may be similarly produced on a glass plate G13 with a thickness d6. Surfaces R11 and R12 of the glass plate G11 may be parallel, concave or convex near the optical axis. Surfaces R15 and R16 of the glass plate G13 may be parallel, concave or convex near the optical axis. According to the present embodiment the surfaces R11 and R12 of the glass plate G11 and surfaces R15 and R16 of the glass plate G13 are parallel near the optical axis. The first lens structure L1 illustrated in FIG. 4 has a positive refractive power, where surfaces R10 and R12 are, respectively, convex and concave. Under these conditions, the terms in equations (8) and (9) simplify to:

$$\frac{X_{p1}}{f_1} + \frac{X_{p2}}{f_2} + \frac{X_{p3}}{f_3} + \frac{X_{p4}}{f_4} = \frac{X}{f} \quad (10)$$

$$\frac{1}{f_1 V_{p1}} + \frac{1}{f_2 V_{p2}} + \frac{1}{f_3 V_{p3}} + \frac{1}{f_4 V_{p4}} = \frac{1}{fV} \quad (11)$$

The second lens structure L2 may have a positive or negative refractive power, where surfaces R14 and R17 are, respectively, concave and convex. Surface R16 may also be concave near the optical axis. Surfaces R10 and R17 may be made of a weakly dispersive material, i.e., having a high Abbe number, whereas surfaces R13 and R14 may be made of a highly dispersive material, i.e., having a low Abbe number. By satisfying the above-mentioned conditions, i.e., equations (10) and (11) pertaining to the surface shapes, materials and dispersion relations, thermal insensitivity and chromatic aberration correction may be more readily implemented. Opposing surfaces, e.g., surfaces R13 and R14 of the first and second lens structures L1 and L2 may be aspheric.

Figure 5:
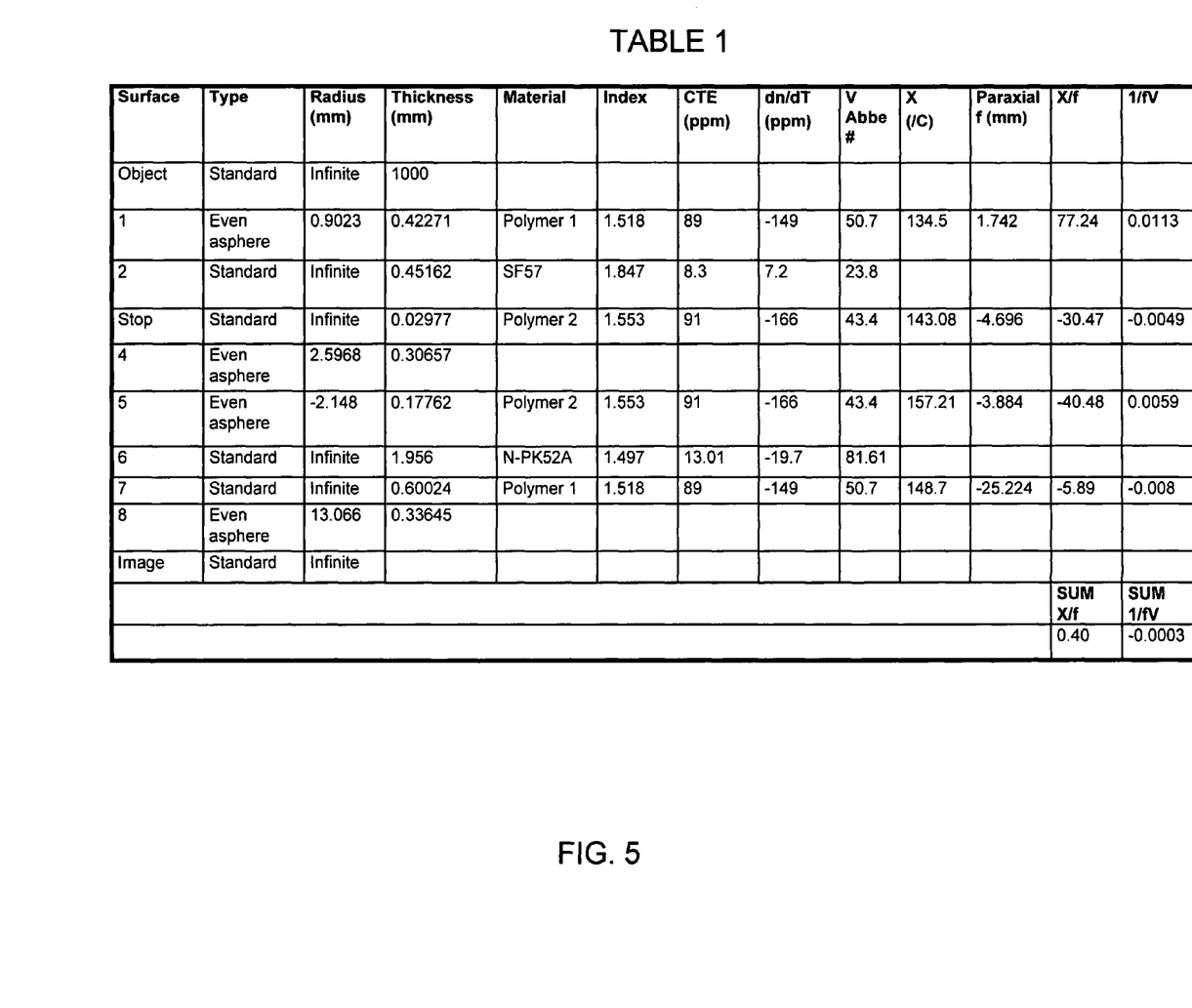
FIG. 5 illustrates a table of properties for the optical structure of FIG. 4.

Details of the optical device are defined by the parameters given in Table 1 of FIG. 5. The materials and their properties are for illustration only, although they are representative of readily available polymers and glasses. As may be seen therein, the overall optothermal response of the optical device is significantly smaller than that of any lens surface itself. Further, the overall chromatic sensitivity of the optical device is significantly smaller than that of any lens surface itself.

Typically, imaging with high resolution onto a planar sensor would require three separate lenses, e.g., first and third lenses of positive power, and a second lens of negative power between the first and third lenses, the lenses being made of different materials to minimize both chromatic and geometric aberrations. However, by using characteristics of both substrates and polymers used to form lens structures, only two individual lenses may be employed, as illustrated in FIG. 4. Thus, light output from the fourth lens surface R17 may be directly incident on the sensor 350, i.e., no elements having optical power may be between the fourth lens surface and the sensor 350, other than optical elements that are part of the sensor package, e.g., a microlens array and/or a cover glass. Additionally, these lens structures may be monolithically manufactured.

Thus, by using different materials, thicknesses, and designs, and increasing the degrees of design freedom available using polymer on substrate lens structures, numerous advantages may be realized. These advantages may include improved optothermal performance, cheaper optical structures, more compact optical structures, mass-produced multiple surface designs, etc.

It will be understood that, although the terms "first" and "second" etc. may be used herein to describe various elements, structures, components, regions, layers and/or sections, these elements, structures, components, regions, layers and/or sections should not be limited by these terms. These terms are only used to distinguish one element, structure, component, region, layer and/or section from another element, structure, component, region, layer and/or section. Thus, a first element, structure, component, region, layer or section discussed below could be termed a second element, structure, component, region, layer or section without departing from the teachings of exemplary embodiments.

Spatially relative terms, such as "beneath," "below," "lower," "above," "upper" and the like, may be used herein for ease of description to describe one element or feature relationship to another element(s) or feature(s) as illustrated in the figures. It will be understood that the spatially relative terms are intended to encompass different orientations of the device in use or operation in addition to the orientation depicted in the figures. For example, if the device in the figures is turned over (or upside down), elements or layers described as "below" or "beneath" other elements or layers would then be oriented "above" the other elements or layers. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

Exemplary embodiments are described herein with reference to cross-sectional illustrations that are schematic illustrations of idealized embodiments (and intermediate structures) of exemplary embodiments. As such, variations from the shapes of the illustrations as a result, for exemplary, of manufacturing techniques and/or tolerances, are to be expected. Thus, exemplary embodiments should not be construed as limited to the particular shapes of regions illustrated herein but are to include deviations in shapes that result, for exemplary, from manufacturing. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An optical device, comprising:
    a transparent, rigid substrate having substantially planar opposing first and second surfaces;
    a first replicated refractive surface on the first surface of the substrate in a first material; and
    a second replicated refractive surface on the second surface of the substrate, the second replicated refractive surface being made of a second material, different from the first material, wherein the material and curvature of the first replicated surface, the material and curvature of the second replicated surface, and a material of the substrate are each configured to substantially reduce the thermal sensitivity of the optical device.

2. The optical device as claimed in claim 1, wherein the first and second surfaces of the substrate are substantially parallel.

3. The optical device as claimed in claim 1, where the material and curvature of the first replicated surface and the material and curvature of the second replicated surface are configured to substantially reduce the chromatic dispersion of the optical device.

4. The optical device as claimed in claim 1, wherein the first replicated refractive surface and the second replicated refractive surface are formed on the substrate while the substrate is part of a wafer.

5. The optical device as claimed in claim 1, further comprising:
    another transparent substrate adjacent the transparent substrate;
    a third replicated refractive surface on a first surface of the another substrate in a third material; and
    a fourth replicated refractive surface on a second surface, opposite the first surface, of the another substrate and in a fourth material, the first to fourth replicated refractive surfaces being aligned along an optical axis.

6. The optical device as claimed in claim 5, wherein the first surface of the another substrate is secured to the second surface of the substrate.

7. The optical device as claimed in claim 5, wherein the first and fourth materials are the same.

8. The optical device as claimed in claim 5, wherein at least one of the first and second refractive surfaces is aspheric and at least one of the third and fourth refractive surfaces is aspheric.

9. The optical device as claimed in claim 5, where the material and curvature of the first replicated surface and the material and curvature of the second replicated surface are configured to substantially reduce the chromatic dispersion of the optical device.

10. The optical device as claimed in claim 5, wherein the first and second surfaces of the substrate and the first and second surfaces of the another substrate are all substantially planar.

11. The optical device as claimed in claim 10, wherein the first and second surfaces of the substrate and the first and second surfaces of the another substrate are all substantially parallel.

12. The optical device as claimed in claim 5, further comprising an image sensor configured to receive light output from the fourth replicated refractive surface.

13. The optical device as claimed in claim 12, wherein light output from the fourth replicated refractive surface is directly incident on the image sensor.

14. An optical device, comprising:
a first transparent substrate;
a first replicated refractive surface on a first surface of the first substrate in a first material;
a second replicated refractive surface on a second surface, opposite the first surface, and made of a second material, different from the first material;
a second transparent substrate adjacent the first transparent substrate;
a third replicated refractive surface on a first surface of the second substrate in a third material; and
a fourth replicated refractive surface on a second surface, opposite the first surface, of the second substrate and in a fourth material, wherein
the first to fourth replicated refractive surfaces are aligned along an optical axis, and
the third and fourth materials are the same.

15. The optical device as claimed in claim 14, further comprising an image sensor configured to receive light output from the fourth replicated refractive surface.

16. An optical device, comprising:
a first transparent substrate;
a first replicated refractive surface on a first surface of the first substrate in a first material;
a second replicated refractive surface on a second surface, opposite the first surface, and made of a second material, different from the first material;
a second transparent substrate adjacent the first transparent substrate;
a third replicated refractive surface on a first surface of the second substrate in a third material; and
a fourth replicated refractive surface on a second surface, opposite the first surface, of the second substrate and in a fourth material, wherein
the first to fourth replicated refractive surfaces are aligned along an optical axis,
the first surface of the second substrate is secured to the second surface of the first substrate,
the first and fourth materials are the same, and
the second and third materials are the same.

17. The optical device as claimed in claim 16, further comprising an image sensor configured to receive light output from the fourth replicated refractive surface.

18. An optical device, comprising:
a first transparent substrate;
a first replicated refractive surface on a first surface of the first substrate in a first material;
a second replicated refractive surface on a second surface, opposite the first surface, and made of a second material, different from the first material;
a second transparent substrate adjacent the first transparent substrate;
a third replicated refractive surface on a first surface of the second substrate in a third material; and
a fourth replicated refractive surface on a second surface, opposite the first surface, of the second substrate and in a fourth material, wherein
the first to fourth replicated refractive surfaces are aligned along an optical axis, and
the first substrate and the second substrate are formed of different materials.

19. An optical device, comprising:
a first transparent substrate;
a first replicated refractive surface on a first surface of the first substrate in a first material;
a second replicated refractive surface on a second surface, opposite the first surface, and made of a second material, different from the first material;
a second transparent substrate adjacent the first transparent substrate;
a third replicated refractive surface on a first surface of the second substrate in a third material; and
a fourth replicated refractive surface on a second surface, opposite the first surface, of the second substrate and in a fourth material, wherein
the first to fourth replicated refractive surfaces are aligned along an optical axis, and
the first substrate and the second substrate have different thicknesses.

20. The optical device as claimed in claim 19, further comprising an image sensor configured to receive light output from the fourth replicated refractive surface.

21. An optical device, comprising:
a first transparent substrate;
a first replicated refractive surface on a first surface of the first substrate in a first material;
a second replicated refractive surface on a second surface, opposite the first surface, and made of a second material, different from the first material;
a second transparent substrate adjacent the first transparent substrate;
a third replicated refractive surface on a first surface of the second substrate in a third material; and
a fourth replicated refractive surface on a second surface, opposite the first surface, of the second substrate and in a fourth material, wherein
the first to fourth replicated refractive surfaces are aligned along an optical axis, and
the first to fourth materials are all different.

22. The optical device as claimed in claim 21, further comprising an image sensor configured to receive light output from the fourth replicated refractive surface.

23. An optical device, comprising:
a first surface in a first material having a first coefficient of optothermal expansion; and
a second surface in a second material having a second coefficient of optothermal expansion on the first surface, the second surface having a radius of curvature, the first and second surfaces being designed to substantially reduce the coefficient of optothermal expansion for the optical device, wherein, when first surface has a radius of curvature R1, the radius of curvature R2 of the second surface is given by $$R2 = R1\left[1 + \frac{X2(n2-1)}{X1(n1-1)}\right]$$

where X1 is the first coefficient of optothermal expansion, X2 is the second coefficient of optothermal expansion, n1 is the refractive index of the first material, and n2 is the refractive index of the second material.

24. A method of forming an optical device, the method comprising:
providing a plurality of first surfaces in a first material having a first coefficient of optothermal expansion;
providing a plurality of second surfaces in a second material having a second coefficient of optothermal expansion on corresponding first surfaces, the second surfaces having a radius of curvature, thereby forming a plurality of optical devices;
designing the first and second surfaces to minimize at least one of the coefficient of optothermal expansion and chromatic dispersion for the optical device; and
singulating the plurality of optical devices to form the optical device.

25. The method as claimed in claim 24, wherein the plurality of first surfaces are on a substantially planar portion of a rigid substrate.

26. An optical device, comprising:
a first transparent substrate;
a first replicated refractive surface on a first surface of the first substrate in a first material;
a second replicated refractive surface on a second surface, opposite the first surface, and made of a second material;
a second transparent substrate adjacent the first transparent substrate;
a third replicated refractive surface on a first surface of the second substrate in a third material; and
a fourth replicated refractive surface on a second surface, opposite the first surface, of the second substrate and in a fourth material,
wherein the material and curvature of the first to fourth replicated refractive surfaces, and materials of the substrates are each configured to substantially reduce the thermal sensitivity of the optical device.

27. The optical device as claimed in claim 26, wherein the material and curvature of the first to fourth replicated refractive surfaces are configured to substantially reduce the chromatic dispersion of the optical device.

28. The optical device as claimed in claim 26, wherein the first and second surfaces of the substrate and the first and second surfaces of the another substrate are all substantially planar.

29. The optical device as claimed in claim 28, wherein the first and second surfaces of the substrate and the first and second surfaces of the another substrate are all substantially parallel.

* * * * *